US012573465B2

(12) United States Patent
Moon

(10) Patent No.: US 12,573,465 B2
(45) Date of Patent: Mar. 10, 2026

(54) ERROR CORRECTION CODE CIRCUIT AND SEMICONDUCTOR APPARATUS INCLUDING THE ERROR CORRECTION CODE CIRCUIT

(71) Applicant: SK hynix Inc., Icheon-si (KR)

(72) Inventor: Hong Ki Moon, Icheon-si (KR)

(73) Assignee: SK hynix Inc., Icheon (KR)

( * ) Notice: Subject to any disclaimer, the term of this patent is extended or adjusted under 35 U.S.C. 154(b) by 396 days.

(21) Appl. No.: 18/104,907

(22) Filed: Feb. 2, 2023

(65) Prior Publication Data

US 2024/0079076 A1 Mar. 7, 2024

(30) Foreign Application Priority Data

Sep. 2, 2022 (KR) .......................... 10-2022-0111301

(51) Int. Cl.
*G11C 29/42* (2006.01)
*G11C 29/12* (2006.01)
*G11C 29/14* (2006.01)
*G11C 29/44* (2006.01)

(52) U.S. Cl.
CPC .......... *G11C 29/42* (2013.01); *G11C 29/1201* (2013.01); *G11C 29/14* (2013.01); *G11C 2029/4402* (2013.01)

(58) Field of Classification Search
None
See application file for complete search history.

(56) References Cited

U.S. PATENT DOCUMENTS

2019/0250985 A1* 8/2019 Seo ..................... G06F 11/1068
2019/0340067 A1 11/2019 Kim et al.
2021/0359710 A1 11/2021 Jo et al.

* cited by examiner

*Primary Examiner* — Alfredo Bermudez Lozada
(74) *Attorney, Agent, or Firm* — WILLIAM PARK AND ASSOCIATES LTD.

(57) ABSTRACT

An embodiment includes: an error information processing circuit configured to generate error information according to syndrome information; and a data correction circuit configured to correct an error in data according to the syndrome information. In a test mode, only the error information processing circuit between the error information processing circuit and the data correction circuit is configured to be activated.

6 Claims, 8 Drawing Sheets

200-1

<u>100</u>

<u>360</u>

<u>370</u>

| FIRST ECC CONTROL MODE (TM<1>=0) | NORMAL MODE | | TEST MODE | |
|---|---|---|---|---|
| | READ | WRITE | READ | WRITE |
| WTSB | 1 | 0 | 1 | 0 |
| TM<0> | 0 | 0 | 1 | 1 |
| CTRL1 | 1 | 0 | 1 | 0 |
| CTRL2 | 1 | 0 | 0 | 0 |

| SECOND ECC CONTROL MODE (TM<1>=1) | NORMAL MODE | | TEST MODE | |
|---|---|---|---|---|
| | READ | WRITE | READ | WRITE |
| WTSB | X | X | X | X |
| TM<0> | 0 | 0 | 1 | 1 |
| CTRL1 | 1 | 1 | 0 | 0 |
| CTRL2 | 1 | 1 | 0 | 0 |

ERROR CORRECTION CODE CIRCUIT AND SEMICONDUCTOR APPARATUS INCLUDING THE ERROR CORRECTION CODE CIRCUIT

CROSS-REFERENCES TO RELATED APPLICATION

The present application claims priority under 35 U.S.C. § 119(a) to Korean application number 10-2022-0111301, filed on Sep. 2, 2022, in the Korean Intellectual Property Office, which is incorporated herein by reference in its entirety.

BACKGROUND

1. Technical Field

The present disclosure relates to a semiconductor circuit, and particularly, to an error correction code circuit and a semiconductor apparatus including the error correction code circuit.

2. Related Art

In a semiconductor apparatus, for example, a semiconductor memory apparatus, time required for specifications related to various operations is reduced due to an increase in an operating speed, resulting in an increase in a bit error rate. Therefore, the semiconductor apparatus has an error correction code (ECC) function for correcting a bit error and providing error information to the outside.

SUMMARY

An error correction code circuit in accordance with an embodiment of the present disclosure may include: an error information processing circuit configured to generate error information according to syndrome information; and a data correction circuit configured to correct an error in data according to the syndrome information. In a test mode, only the error information processing circuit between the error information processing circuit and the data correction circuit may be configured to be activated.

An error correction code circuit in accordance with an embodiment of the present disclosure may include: an error correction code engine configured to generate syndrome information by performing an operation on data in response to a first control signal; an error information processing circuit configured to generate error information according to the syndrome information; a data correction circuit configured to correct an error in the data according to the syndrome information in response to a second control signal; and a control signal generation circuit configured to generate the first control signal and the second control signal in response to a write/read status signal and one or more test mode signals.

A semiconductor apparatus in accordance with an embodiment of the present disclosure may include: a memory area; a data input/output circuit connected to the memory area and configured to exchange data with an external system or the memory area; and an error correction code circuit connected to the data input/output circuit and configured to perform an error information processing operation for generating syndrome information according to the data and generating information on an error included in the data by using the syndrome information and a data correction operation for correcting the error in the data. The error correction code circuit may be configured to perform only the error information processing operation between the error information processing operation and the data correction operation in a test mode.

DETAILED DESCRIPTION

Hereinafter, embodiments of the present disclosure will be described in more detail with reference to the accompanying drawings.

Various embodiments are directed to providing an error correction code circuit capable of improving the reliability of an ECC function and a semiconductor apparatus including the same.

Figure 1:
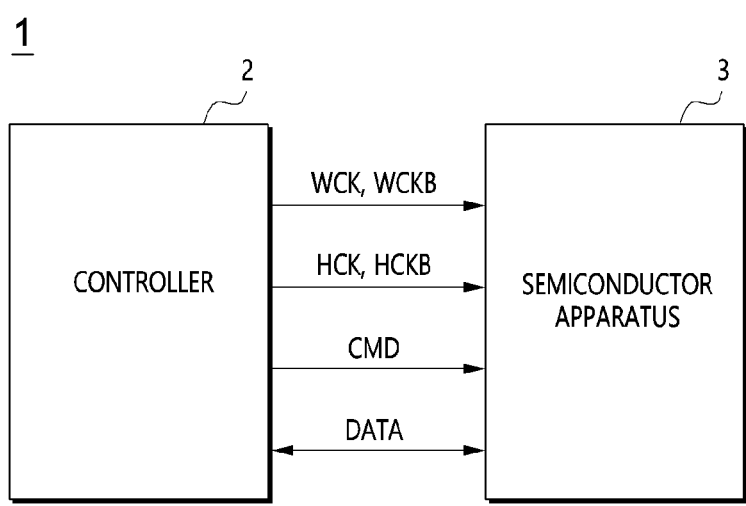
FIG. 1 is a diagram illustrating the configuration of a semiconductor system in accordance with an embodiment of the present disclosure.

FIG. 1 is a diagram illustrating the configuration of a semiconductor system 1 in accordance with an embodiment of the present disclosure.

Referring to FIG. 1, the semiconductor system 1 in accordance with an embodiment of the present disclosure may include a controller 2 and a semiconductor apparatus 3.

The controller 2 may include a graphic processing unit (GPU), a central processing unit (CPU), or the like. The controller 2 may provide the semiconductor apparatus 3 with external clock signals, for example, data clock signals WCK/WCKB, system clock signals HCK/HCKB, and a command signal CMD. The data clock signals WCK/WCKB and the system clock signals HCK/HCKB may be different in cycle and/or frequency from one another. The controller 2 may provide the data clock signals WCK/WCKB to the semiconductor apparatus 3 when writing data. The controller 2 may receive data, which is output from the semiconductor apparatus 3, according to a read command.

The semiconductor apparatus 3 may use a multi-phase clock signal as a reference signal for a read or write operation. The semiconductor apparatus 3 may generate the multi-phase clock signal by using the external clock signals, for example, the data clock signals WCK/WCKB. The semiconductor apparatus 3 may be a volatile memory apparatus, a nonvolatile memory apparatus, or a memory apparatus in which volatile and nonvolatile memories are mixed. The semiconductor apparatus 3 may include an ECC circuit configured as hardware and/or software for supporting an ECC function. The semiconductor apparatus 3 may correct an error in data by performing the ECC function, output error-corrected data, and output data including information on the error included in the data.

Figure 2:
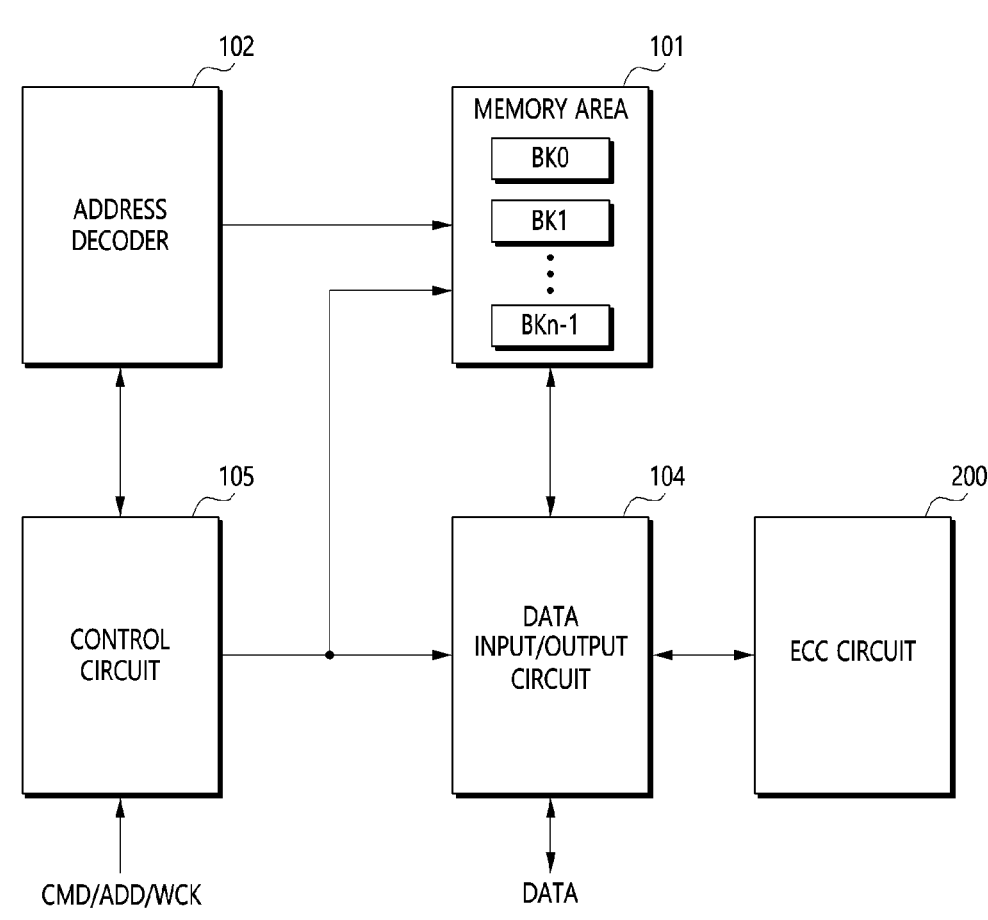
FIG. 2 is a block diagram illustrating the configuration of a semiconductor apparatus in accordance with an embodiment of the present disclosure.

FIG. 2 is a block diagram illustrating the configuration of a semiconductor apparatus 100 in accordance with an embodiment of the present disclosure.

Referring to FIG. 2, the semiconductor apparatus 100 in accordance with an embodiment of the present disclosure may include a memory area 101, an address decoder 102, a data input/output circuit 104, a control circuit 105, and an ECC circuit 200.

The memory area 101 may include a plurality of memory cells, and the plurality of memory cells may each include at least one of a volatile memory and a nonvolatile memory. Examples of the volatile memory may include a static RAM (SRAM), a dynamic RAM (DRAM), and a synchronous DRAM (SDRAM), and examples of the nonvolatile memory may include a read only memory (ROM), a programmable ROM (PROM), an electrically erasable and programmable ROM (EEPROM), an electrically programmable ROM (EPROM), a flash memory, a phase-change RAM (PRAM), a magnetic RAM (MRAM), a resistive RAM (RRAM), and a ferroelectric RAM (FRAM). During a read operation of the semiconductor apparatus 100, data stored in the memory area 101 may be output. During a write operation for the semiconductor apparatus 100, data input from an external system, for example, a memory controller or test equipment may be stored in the memory area 101. The memory cells of the memory area 101 may be divided into a plurality of unit memory areas, for example, a plurality of memory banks BK0 to BKn−1.

The address decoder 102 may be connected to the control circuit 105 and the memory area 101. The address decoder 102 may decode an address signal provided by the control circuit 105, and access the memory area 101 in response to the decoding result.

The data input/output circuit 104 may be connected to the memory area 101. The data input/output circuit 104 may exchange data with the external system or the memory area 101. The data input/output circuit 104 may include a data input buffer, a data output buffer, a data input/output pad DQ, a pipe register, a test-related circuit, and the like.

The control circuit 105 may be connected to the memory area 101, the address decoder 102, and the data input/output circuit 104. The control circuit 105 may perform a control operation related to a test operation, the read operation, the write operation, and address processing of the semiconductor apparatus 100. The control circuit 105 may receive a command CMD, an address ADD, a clock signal WCK, and the like through a plurality of pads (not illustrated). The control circuit 105 may provide the data input/output circuit 104 with the address decoded through the address decoder 102.

The ECC circuit 200, that is, an error correction code circuit, may be connected to the data input/output circuit 104. The ECC circuit 200 may exchange data with the data input/output circuit 104. The ECC circuit 200 may perform an error information processing operation for generating a parity bit and syndrome information according to data and generating information on an error included in the data by using the syndrome information, and a data correction operation for correcting an error in the data. The error information generated according to the error information processing operation and error-corrected data generated according to the data correction operation may be output to the outside of the semiconductor apparatus 100 through the data input/output circuit 104. The ECC circuit 200 may be configured to perform only the error information processing operation between the error information processing operation and the data correction operation in a test mode of the semiconductor apparatus 100. The ECC circuit 200 may be configured to perform the data correction operation only during a read operation in a normal mode of the semiconductor apparatus 100.

Figure 3:
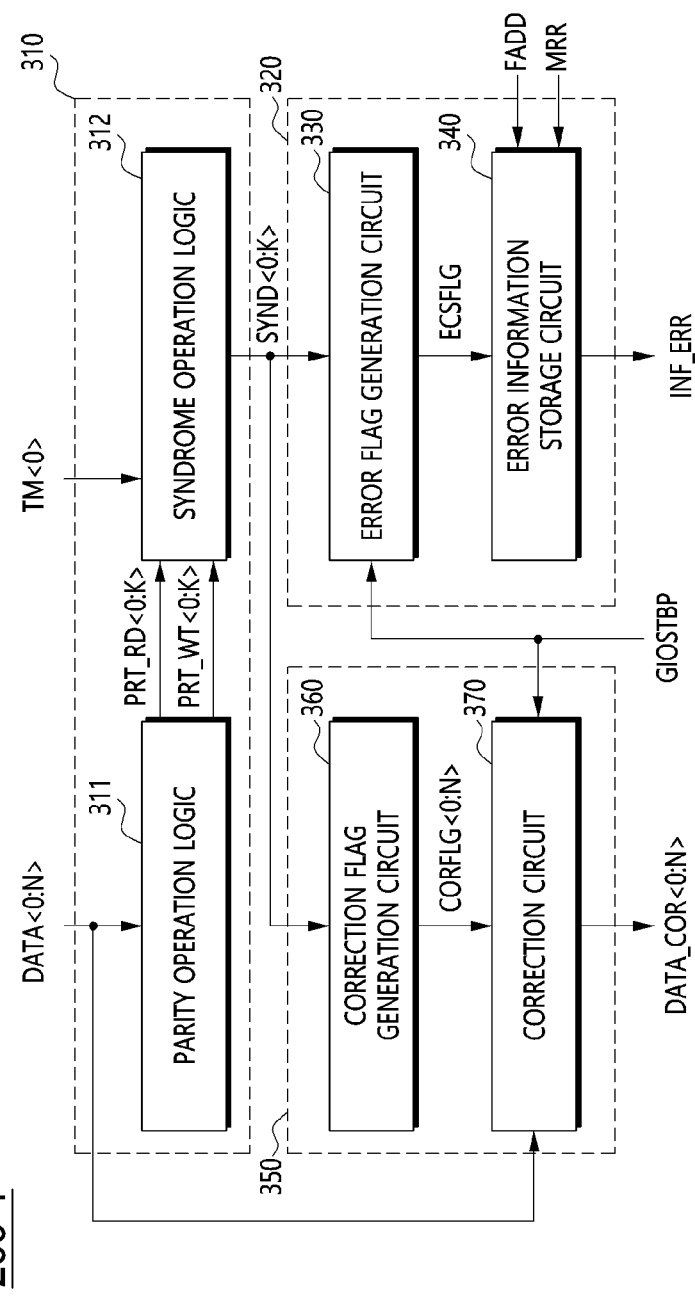
FIG. 3 is a diagram illustrating the configuration of an ECC circuit in accordance with an embodiment of the present disclosure.

FIG. 3 is a diagram illustrating the configuration of an ECC circuit 200-1 in accordance with an embodiment of the present disclosure.

Referring to FIG. 3, the ECC circuit 200-1 may include an ECC engine 310, an error information processing circuit 320, and a data correction circuit 350.

The ECC engine 310 may receive data DATA<0:N> and output syndrome information SYND<0:K>. The ECC engine 310 may be configured to generate the syndrome information SYND<0:K> according to the data DATA<0:N>. The ECC engine 310 may be configured based on a block code or a convolution code. Representative examples of the block code may include a Hamming code, a Reed Solomon (RS) code, and a Bose-Chaudhuri-Hocquenghem (BCH) code, and representative examples of the convolution code may include a Viterbi code and a Turbo code. The ECC engine 310 may include a parity operation logic 311 and a syndrome operation logic 312.

The parity operation logic 311 may receive the data DATA<0:N> and output parity signals. The parity operation logic 311 may generate the parity signals by performing an operation on the data DATA<0:N>. The parity signals may be divided into a read parity signal PRT_RD<0:K> and a write parity signal PRT_WT<0:K>. The read parity signal PRT_RD<0:K> is a parity signal generated by the parity operation logic 311 that performs an operation on the data DATA<0:N> during a read operation for the semiconductor apparatus 100. The write parity signal PRT_WT<0:K> is a parity signal generated by the parity operation logic 311 that performs an operation on the data DATA<0:N> during a write operation for the semiconductor apparatus 100.

The syndrome operation logic 312 may receive the read parity signal PRT_RD<0:K>, a first test mode signal TM<0>, and the write parity signal PRT_WT<0:K>, and output the syndrome information SYND<0:K>. The first test mode signal TM<0> may be activated in a test mode of the semiconductor apparatus 100. The test mode of the semiconductor apparatus 100 may include a wafer level test. The syndrome operation logic 312 may generate the syndrome information SYND<0:K> in response to the read parity signal PRT_RD<0:K>, the first test mode signal TM<0>, and the write parity signal PRT_WT<0:K>. The syndrome operation logic 312 may generate the syndrome information SYND<0: K> by comparing a currently generated read parity signal PRT_RD<0:K> and a write parity signal PRT_WT<0:K> generated and stored during a previous write operation. The syndrome operation logic 312 may be activated in response to the first test mode signal TM<0>. The syndrome operation logic 312 may be activated when the first test mode signal TM<0> is deactivated. The syndrome operation logic 312 may be deactivated when the first test mode signal TM<0> is activated, that is, when the semiconductor apparatus 100 enters a test mode for testing the semiconductor apparatus 100. As the syndrome operation logic 312 is deactivated, operations of the error information processing circuit 320 and the data correction circuit 350 may be stopped.

The error information processing circuit 320 may receive the syndrome information SYND<0:K> and output error information INF_ERR. The error information processing circuit 320 may be configured to generate, store, and output the error information INF_ERR according to the syndrome information SYND<0:K>. The error information processing circuit 320 may include an error flag generation circuit 330 and an error information storage circuit 340.

The error flag generation circuit 330 may receive the syndrome information SYND<0:K> and output an error flag signal ECSFLG. The error flag generation circuit 330 may generate the error flag signal ECSFLG in response to the syndrome information SYND<0:K>. The error flag generation circuit 330 may output the error flag signal ECSFLG in response to an activation of an input/output strobe signal GIOSTBP. The input/output strobe signal GIOSTBP is a signal for setting the timing at which data is transmitted to a global input/output line.

The error information storage circuit 340 may receive the error flag signal ECSFLG, a fail address FADD, and a mode register read command MRR, and output the error information INF_ERR. The error information storage circuit 340 may generate the error information INF_ERR in response to the error flag signal ECSFLG and the fail address FADD. The error information storage circuit 340 may count the error flag signal ECSFLG and store the number of error occurrences. The error information storage circuit 340 may store the fail address FADD in response to the error flag signal ECSFLG. The error information storage circuit 340 may store the number of error occurrences and the fail address FADD as the error information INF_ERR. The error information storage circuit 340 may output the error information INF_ERR in response to the mode register read command MRR.

The data correction circuit 350 may receive the syndrome information SYND<0:K> and the data DATA<0:N>, and output error-corrected data DATA_COR<0:N>. The data correction circuit 350 may be configured to correct an error in the data DATA<0:N> in response to the syndrome information SYND<0:K>, and generate the error-corrected data DATA_COR<0:N>. The data correction circuit 350 may include a correction flag generation circuit 360 and a correction circuit 370.

The correction flag generation circuit 360 may receive the syndrome information SYND<0:K> and output a correction flag signal CORFLG<0:N>. The correction flag generation circuit 360 may generate the correction flag signal CORFLG<0:N> in response to the syndrome information SYND<0:K>.

The correction circuit 370 may receive the data DATA<0:N>, the correction flag signal CORFLG<0:N>, and the input/output strobe signal GIOSTBP, and output the error-corrected data DATA_COR<0:N>. The correction circuit 370 may generate the error-corrected data DATA_COR<0:N> by correcting an error in the data DATA<0:N> according to the correction flag signal CORFLG<0:N>. The correction circuit 370 may output the error-corrected data DATA_COR<0:N> in response to the input/output strobe signal GIOSTBP.

Figure 4:
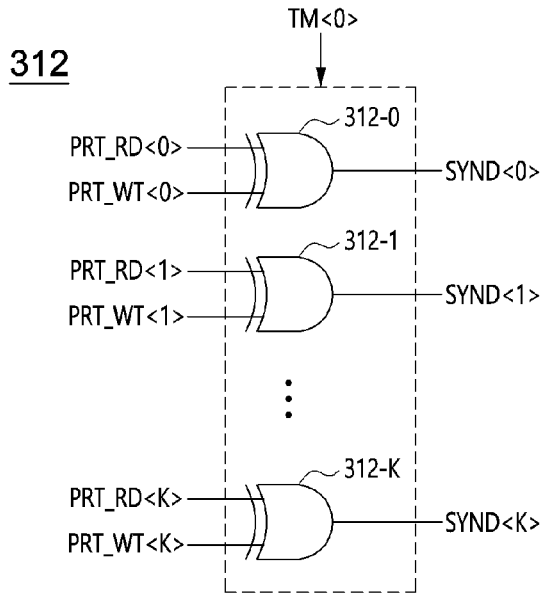
FIG. 4 is a diagram illustrating the configuration of a syndrome operation logic in FIG. 3.

FIG. 4 is a diagram illustrating the configuration of the syndrome operation logic 312 in FIG. 3.

Referring to FIG. 4, the syndrome operation logic 312 may include a plurality of logic gates 312-0 to 312-K. Each of the plurality of logic gates 312-0 to 312-K may perform an XOR operation on one signal bit of the read parity signal PRT_RD<0:K> and one signal bit of the write parity signal PRT_WT<0:K>, and output the XOR operation result as each signal bit of the syndrome information SYND<0:K>. The plurality of logic gates 312-0 to 312-K may be deactivated in response to an activation of the first test mode signal TM<0> and may be activated in response to a deactivation of the first test mode signal TM<0>.

Figure 5:
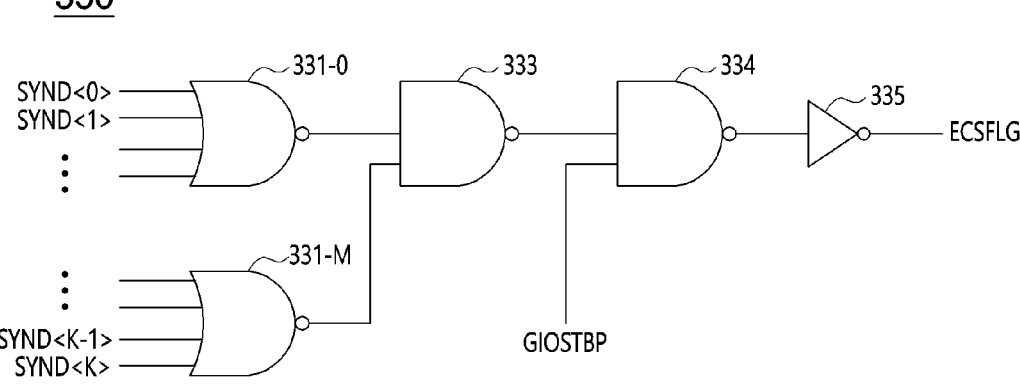
FIG. 5 is a diagram illustrating the configuration of an error flag generation circuit in FIG. 3.

FIG. 5 is a diagram illustrating the configuration of the error flag generation circuit 330 in FIG. 3.

Referring to FIG. 5, the error flag generation circuit 330 may include a plurality of logic gates 331-0 to 331-M and 333 to 335. The logic gates 331-0 to 331-M may perform a NOR operation on all the signal bits of the syndrome information SYND<0:K> and output NOR operation results. The logic gate 333 may perform a NAND operation on the outputs of the logic gates 331-0 to 331-M and output the NAND operation result. The logic gates 334 and 335 may output, as the error flag signal ECSFLG, a signal obtained by performing an AND operation on the output of the logic gate 333 and the input/output strobe signal GIOSTBP.

Figure 6:
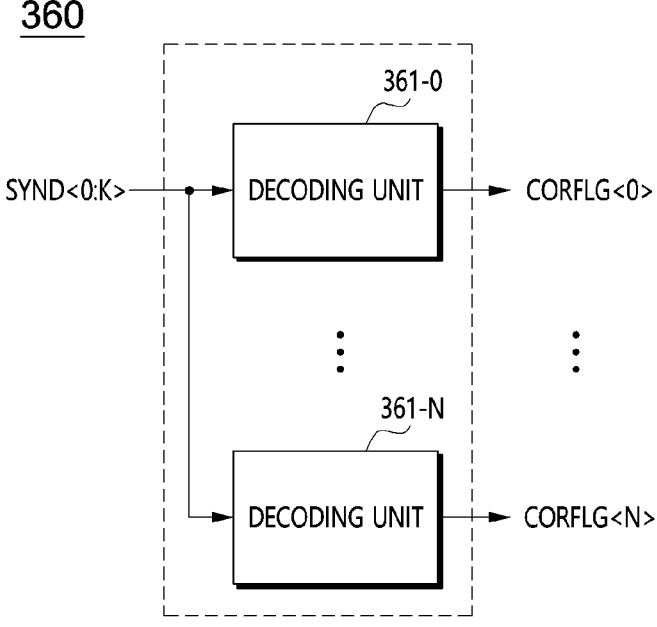
FIG. 6 is a diagram illustrating the configuration of a correction flag generation circuit in FIG. 3.

FIG. 6 is a diagram illustrating the configuration of the correction flag generation circuit 360 in FIG. 3.

Referring to FIG. 6, the correction flag generation circuit 360 may include a plurality of decoding units 361-0 to 361-N. Each of the decoding units 361-0 to 361-N may output, as the correction flag signal CORFLG<0:N>, a result of decoding the syndrome information SYND<0:K> with different logical combinations.

Figure 7:
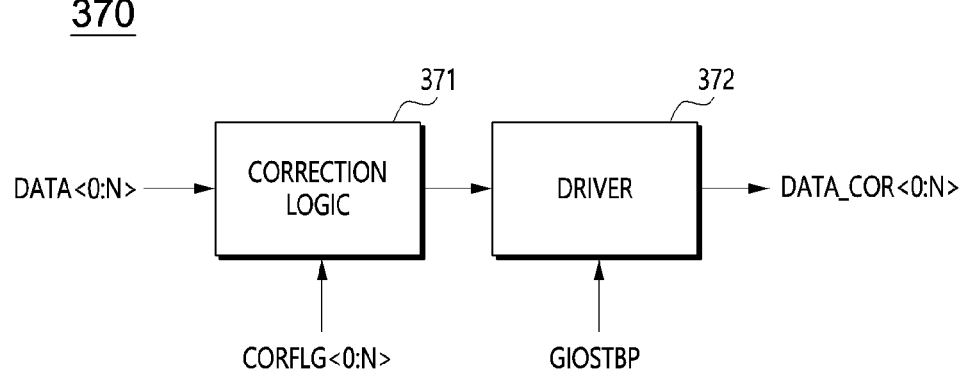
FIG. 7 is a diagram illustrating the configuration of a correction circuit in FIG. 3.

FIG. 7 is a diagram illustrating the configuration of the correction circuit 370 in FIG. 3.

Referring to FIG. 7, the correction circuit 370 may include a correction logic 371 and a driver 372. The correction logic 371 may output a result of correcting an error in the data DATA<0:N> according to the correction flag signal CORFLG<0:N>. The correction logic 371 may correct an error included in the data DATA<0:N> by selectively inverting bits of the data DATA<0:N> according to the correction flag signal CORFLG<0:N>. The correction logic 371 may perform error correction by inverting the logic level of a bit (or bits) of the data DATA<0:N> corresponding to a bit (or bits) having a logic high value in the correction flag signal CORFLG<0:N>. The driver 372 may output the output of the correction logic 371 as the error-corrected data DATA_COR<0:N> in response to the input/output strobe signal GIOSTBP.

Figure 8:
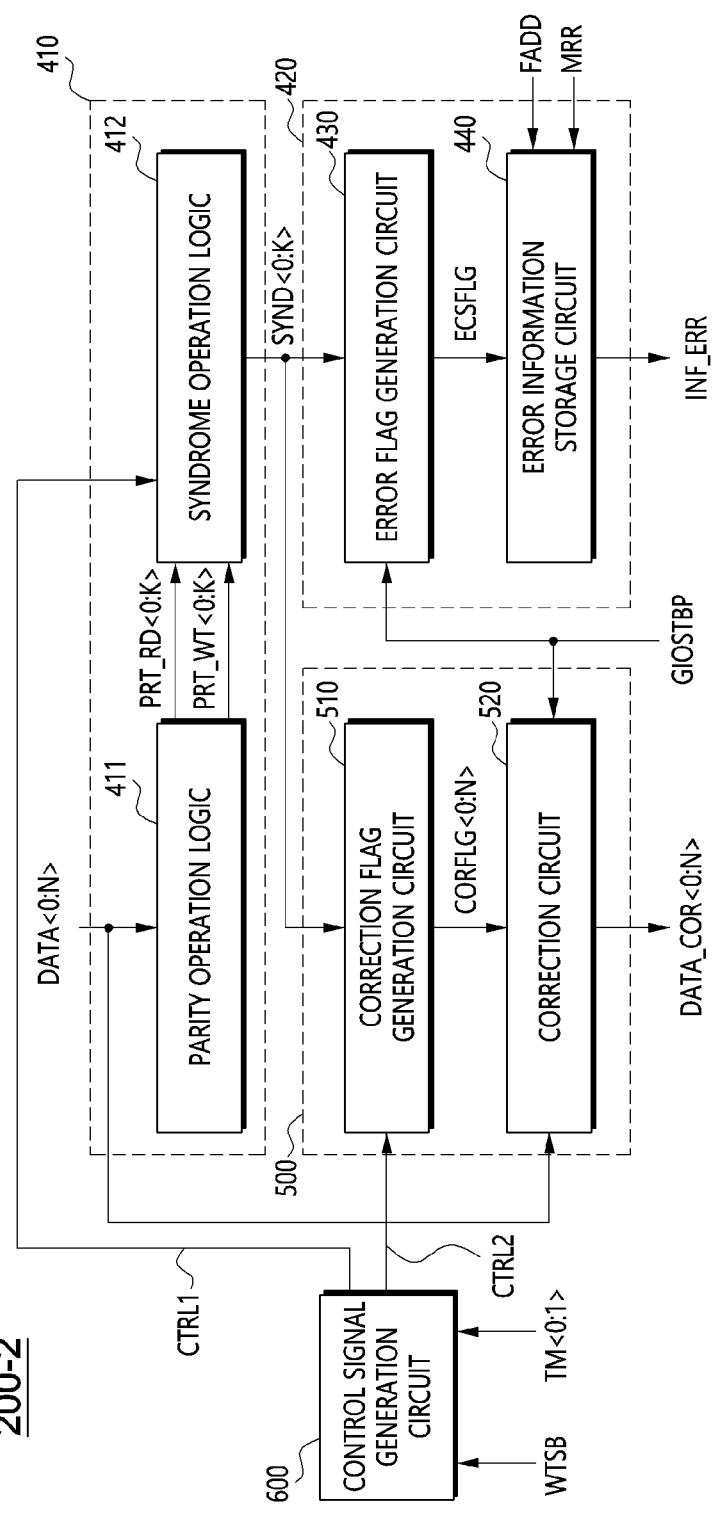
FIG. 8 is a diagram illustrating the configuration of an ECC circuit in accordance with another embodiment of the present disclosure.

FIG. 8 is a diagram illustrating the configuration of an ECC circuit 200-2 in accordance with another embodiment of the present disclosure.

Referring to FIG. 8, the ECC circuit 200-2 may include an ECC engine 410, an error information processing circuit 420, a data correction circuit 500, and a control signal generation circuit 600.

The ECC engine 410 may receive data DATA<0:N> and output syndrome information SYND<0:K>. The ECC engine 410 may be configured to generate the syndrome information SYND<0:K> according to the data DATA<0:N>. The ECC engine 410 may include a parity operation logic 411 and a syndrome operation logic 412.

The parity operation logic 411 may receive the data DATA<0:N> and output parity signals. The parity operation logic 411 may generate a read parity signal PRT_RD<0:K> by performing an operation on the data DATA<0:N> during a read operation of the semiconductor apparatus 100. The parity operation logic 411 may generate a write parity signal PRT_WT<0:K> by performing an operation on the data DATA<0:N> during a write operation of the semiconductor apparatus 100.

The syndrome operation logic 412 may receive the read parity signal PRT_RD<0:K>, a first control signal CTRL1, and the write parity signal PRT_WT<0:K>, and output the syndrome information SYND<0:K>. The syndrome operation logic 412 may generate the syndrome information SYND<0:K> in response to the read parity signal PRT_RD<0:K>, the first control signal CTRL1, and the write parity signal PRT_WT<0:K>. The syndrome operation logic 412 may generate the syndrome information SYND<0:K> by comparing a currently generated read parity signal PRT_RD<0:K> and a write parity signal PRT_WT<0:K> generated and stored during a previous write operation. The syndrome operation logic 412 may be activated in response to the first control signal CTRL1. The syndrome operation logic 412 may be activated when the first control signal CTRL1 is activated, and may be deactivated when the first control signal CTRL1 is deactivated. As the syndrome operation logic 412 is deactivated, operations of the error information processing circuit 420 and the data correction circuit 500 may be stopped.

The error information processing circuit 420 may receive the syndrome information SYND<0:K> and output error information INF_ERR. The error information processing circuit 420 may be configured to generate, store, and output the error information INF_ERR according to the syndrome information SYND<0:K>. The error information processing circuit 420 may include an error flag generation circuit 430 and an error information storage circuit 440.

The error flag generation circuit 430 may receive the syndrome information SYND<0:K> and output an error flag signal ECSFLG. The error flag generation circuit 430 may generate the error flag signal ECSFLG in response to the syndrome information SYND<0:K>. The error flag generation circuit 430 may output the error flag signal ECSFLG in response to an activation of the input/output strobe signal GIOSTBP. The error flag generation circuit 430 may have substantially the same configuration as the error flag generation circuit 330 in FIG. 3.

The error information storage circuit 440 may receive the error flag signal ECSFLG, a fail address FADD, and a mode register read command MRR, and output the error information INF_ERR. The error information storage circuit 440 may count the error flag signal ECSFLG and store the number of error occurrences. The error information storage circuit 440 may store the fail address FADD in response to the error flag signal ECSFLG. The error information storage circuit 440 may store the number of error occurrences and the fail address FADD as the error information INF_ERR. The error information storage circuit 440 may output the error information INF_ERR in response to the mode register read command MRR. The error information storage circuit 440 may have substantially the same configuration as the error information storage circuit 340 in FIG. 3.

The data correction circuit 500 may be configured to correct an error in the data DATA<0:N> in response to the syndrome information SYND<0:K> and a second control signal CTRL2, and to output error-corrected data DATA_COR<0:N> according to the error correction result. The data correction circuit 500 may include a correction flag generation circuit 510 and a correction circuit 520.

The correction flag generation circuit 510 may receive the second control signal CTRL2 and the syndrome information SYND<0:K>, and output a correction flag signal CORFLG<0:N>. The correction flag generation circuit 510 may generate the correction flag signal CORFLG<0:N> in response to the second control signal CTRL2 and the syndrome information SYND<0:K>. The correction flag generation circuit 510 may be activated in response to the second control signal CTRL2. The correction flag generation circuit 510 may be activated in response to an activation of the second control signal CTRL2 and may be deactivated in response to a deactivation of the second control signal CTRL2.

The correction circuit 520 may receive the data DATA<0:N>, the correction flag signal CORFLG<0:N>, and the input/output strobe signal GIOSTBP, and output the error-corrected data DATA_COR<0:N>. The correction circuit 520 may generate the error-corrected data DATA_COR<0:N> by correcting an error in the data DATA<0:N> according to the correction flag signal CORFLG<0:N>. The correction circuit 520 may output the error-corrected data DATA_COR<0:N> in response to an activation of the input/output strobe signal GIOSTBP.

The control signal generation circuit 600 may receive a write/read status signal WTSB, a first test mode signal TM<0>, and a second test mode signal TM<1>, and output the first control signal CTRL1 and the second control signal CTRL2.

Figure 9:
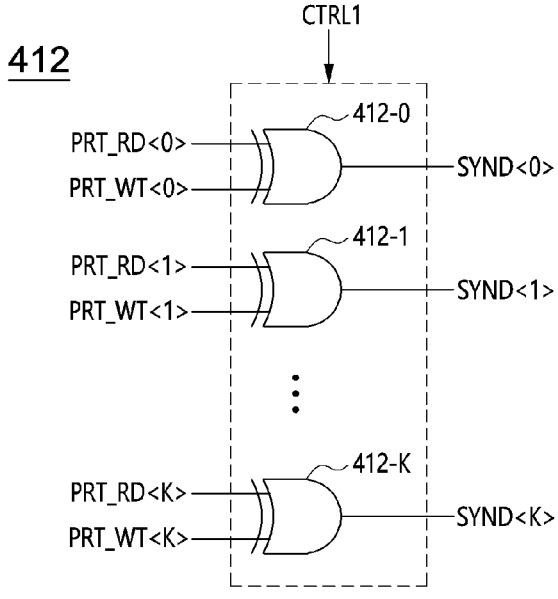
FIG. 9 is a diagram illustrating the configuration of a syndrome operation logic in FIG. 8.

FIG. 9 is a diagram illustrating the configuration of the syndrome operation logic 412 in FIG. 8.

Referring to FIG. 9, the syndrome operation logic 412 may include a plurality of logic gates 412-0 to 412-K. Each of the plurality of logic gates 412-0 to 412-K may perform an XOR operation on one signal bit of the read parity signal PRT_RD<0:K> and one signal bit of the write parity signal PRT_WT<0:K>, and output the XOR operation result as each signal bit of the syndrome information SYND<0:K>. The plurality of logic gates 412-0 to 412-K may be activated in response to an activation of the first control signal CTRL1 and may be deactivated in response to a deactivation of the first control signal CTRL1.

Figure 10:
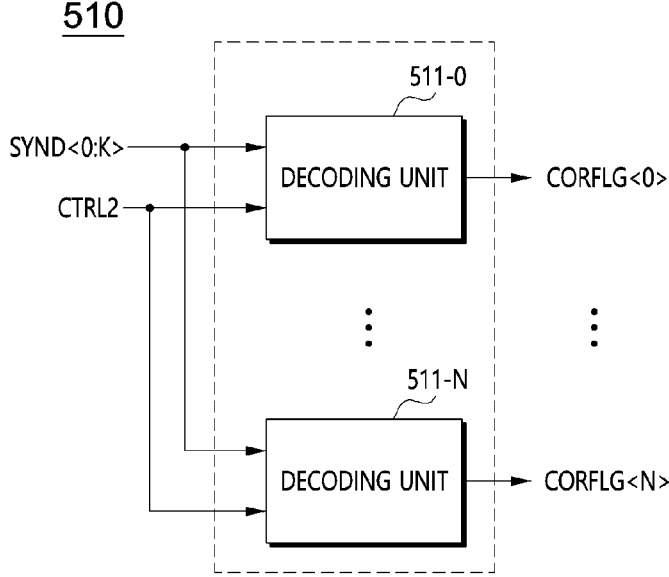
FIG. 10 is a diagram illustrating the configuration of a correction flag generation circuit in FIG. 8.

FIG. 10 is a diagram illustrating the configuration of the correction flag generation circuit 510 in FIG. 8.

Referring to FIG. 10, the correction flag generation circuit 510 may include a plurality of decoding units 511-0 to 511-N. Each of the plurality of decoding units 511-0 to 511-N may output, as the correction flag signal CORFLG<0:N>, a result of decoding the syndrome information SYND<0:K> with different logical combinations. The plurality of decoding units 511-0 to 511-N may be activated in response to an activation of the second control signal CTRL2 and may be deactivated in response to a deactivation of the second control signal CTRL2.

Figure 11:
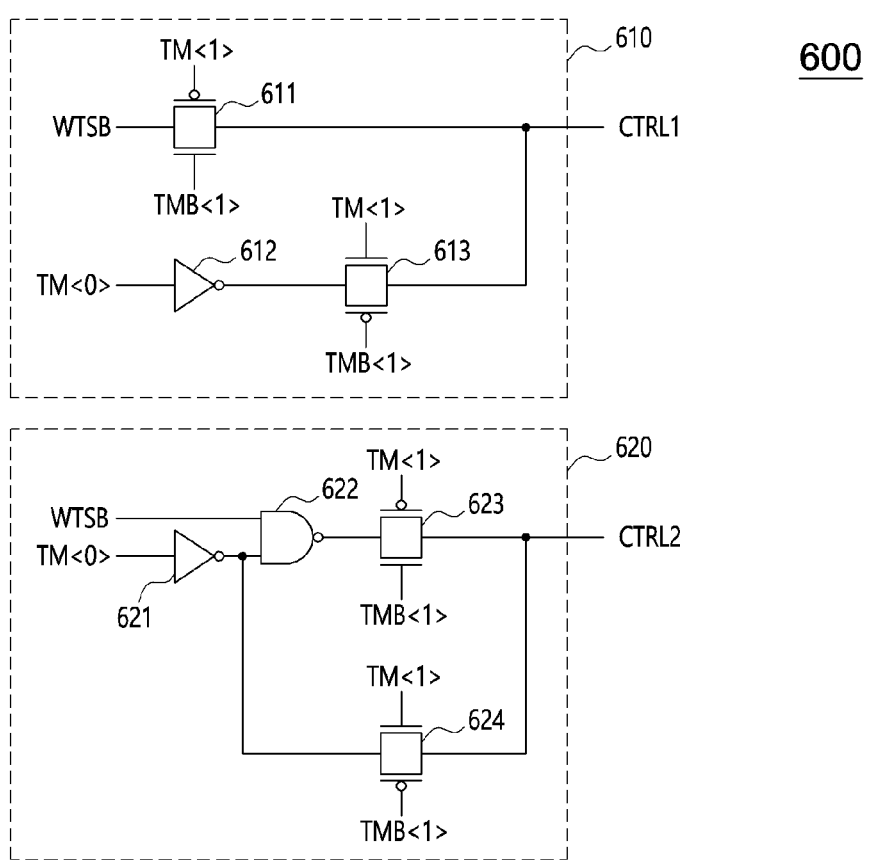
FIG. 11 is a diagram illustrating the configuration of a control signal generation circuit in FIG. 8.

FIG. 11 is a diagram illustrating the configuration of the control signal generation circuit 600 in FIG. 8.

Referring to FIG. 11, the control signal generation circuit 600 may include a first control signal generation circuit 610 and a second control signal generation circuit 620.

The first control signal generation circuit 610 may receive the write/read status signal WTSB, the first test mode signal TM<0>, and the second test mode signal TM<1>, and output the first control signal CTRL1. The write/read status signal WTSB may have a logic value that varies depending on the write operation and the read operation of the semiconductor apparatus 100. For example, the write/read status signal WTSB may have a logic value of "0" during the write operation of the semiconductor apparatus 100 and have a logic value of "1" during the read operation of the semiconductor apparatus 100. The second test mode signal TM<1> may be used to set an operation mode (a first control mode or a second control mode) of the ECC circuit 200-2.

The first control signal generation circuit 610 may include first to third logic gates 611 to 613. The first logic gate 611 may output the write/read status signal WTSB as the first control signal CTRL1 in response to a deactivation of the second test mode signal TM<1>. The second logic gate 612 may invert the first test mode signal TM<0> and output an inverted signal. The third logic gate 613 may output the output signal of the second logic gate 612 as the first control signal CTRL1 in response to an activation of the second test mode signal TM<1>.

The second control signal generation circuit 620 may receive the write/read status signal WTSB, the first test mode signal TM<0>, and the second test mode signal TM<1>, and output the second control signal CTRL2. The second control signal generation circuit 620 may include first to fourth logic gates 621 to 624. The first logic gate 621 may invert the first test mode signal TM<0> and output an inverted signal. The second logic gate 622 may perform a NAND operation on the write/read status signal WTSB and the output signal of the first logic gate 621 and output the NAND operation result. The third logic gate 623 may output the output signal of the second logic gate 622 as the second control signal CTRL2 in response to a deactivation of the second test mode signal TM<1>. The fourth logic gate 624 may output the output signal of the first logic gate 621 as the second control signal CTRL2 in response to an activation of the second test mode signal TM<1>.

The ECC circuit 200-2 of the present disclosure may be operated in any one of the first control mode and the second control mode. The first control mode is an operation mode in which the ECC circuit 200-2 performs only the error information processing operation between the error information processing operation and the data correction operation in the test mode of the semiconductor apparatus 100 and performs the error information processing operation and the data correction operation during the read operation in the normal mode of the semiconductor apparatus 100. The second control mode is an operation mode in which the ECC circuit 200-2 performs both the error information processing operation and the data correction operation regardless of the read operation and the write operation in the normal mode of the semiconductor apparatus 100 and stops both the error information processing operation and the data correction operation in the test mode of the semiconductor apparatus 100.

The second test mode signal TM<1> may be used as a signal for selecting the first control mode and the second control mode. When the second test mode signal TM<1> is deactivated (TM<1>=0), the mode of the ECC circuit 200-2 may be set to the first control mode. When the second test mode signal TM<1> is activated (TM<1>=1), the mode of the ECC circuit 200-2 may be set to the second control mode.

When the second test mode signal TM<1> is deactivated (TM<1>=0), the mode of the ECC circuit 200-2 may be set to the first control mode. In the first control mode, the first control signal CTRL1 is activated during the read operation in the normal mode and during the read operation in the test mode, and is deactivated during the write operation in the normal mode and during the write operation in the test mode. In the first control mode, the second control signal CTRL2 is activated only during the read operation in the normal mode, and is deactivated during the write operation in the normal mode and during the read operation and the write operation in the test mode.

When the second test mode signal TM<1> is activated (TM<1>=1) and the inverted second test mode signal TMB<1> is activated (TMB<1>=0), the mode of the ECC circuit 200-2 may be set to the second control mode. In the second control mode, the first control signal CTRL1 is activated only during the read operation and the write operation in the normal mode, and is deactivated during the read operation and the write operation in the test mode. In the second control mode, the second control signal CTRL2 is deactivated regardless of the normal mode/test mode and the read/write operation.

Hereinafter, an ECC operation in accordance with the present disclosure will be described with reference to FIGS. 8 to 11.

First, an ECC operation for the present disclosure according to the first control mode will be described as follows.

In the first control mode, the first control signal CTRL1 is activated only during a read operation, that is, only during the read operation in the normal mode and the read operation in the test mode. Accordingly, the syndrome operation logic 412 may generate the syndrome information SYND<0:K> while the read operation of the semiconductor apparatus 100 is performed regardless of the normal mode and the test mode.

The error information processing circuit 420 may perform an error information processing operation for generating, storing, and/or outputting the error information INF_ERR according to the syndrome information SYND<0:K>.

In the first control mode, the second control signal CTRL2 is activated only during the read operation in the normal mode.

The data correction circuit 500 may perform a data correction operation for correcting an error in the data DATA<0:N> in response to the syndrome information SYND<0:K> only during the read operation in the normal mode and outputting the error-corrected data DATA_COR<0:N> according to the error correction result.

As a consequence, in an embodiment, the error information processing operation is performed while the read operation in the test mode of the semiconductor apparatus 100 is performed, so that error management performance may be improved and an external monitoring function may be enhanced, which makes it possible to improve ECC operation reliability. Furthermore, in an embodiment, as the data correction operation is stopped except for the read operation in the normal mode of the semiconductor apparatus 100, power consumption caused by the data correction circuit 500 may be reduced.

Next, an ECC operation for the present disclosure according to the second control mode will be described as follows.

In the second control mode, the first control signal CTRL1 is activated during a read operation and a write operation in the normal mode, and is deactivated in the test mode. The second control signal CTRL2 is activated during the read operation and the write operation in the normal mode, and is deactivated in the test mode. Accordingly, the syndrome operation logic 412 may generate the syndrome information SYND<0:K> while the read/write operation in the normal mode of the semiconductor apparatus 100 is performed.

The error information processing circuit 420 may perform an error information processing operation for generating, storing, and/or outputting the error information INF_ERR according to the syndrome information SYND<0:K>. Furthermore, the data correction circuit 500 may perform a data correction operation for correcting an error in the data DATA<0:N> in response to the syndrome information SYND<0:K> and outputting the error-corrected data DATA_COR<0:N> according to the error correction result.

During the test mode operation of the semiconductor apparatus 100 according to the second control mode, both the first control signal CTRL1 and the second control signal CTRL2 are deactivated. Therefore, the operations of the syndrome operation logic 412 and the data correction circuit 500 are stopped. Accordingly, in an embodiment, by applying the second control mode, it is possible to simplify ECC control and cope with various ECC operating environments.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. An error correction code circuit comprising:
an error information processing circuit configured to generate error information according to syndrome information; and
a data correction circuit configured to correct an error in data according to the syndrome information,
wherein in a test mode, only the error information processing circuit between the error information processing circuit and the data correction circuit is configured to be activated,
wherein the error information processing circuit comprises:

an error flag generation circuit configured to generate an error flag signal in response to the syndrome information; and
an error information storage circuit configured to store error information including at least one of the number of error occurrences and a fail address in response to the error flag signal.

2. The error correction code circuit according to claim 1, wherein during a read operation in the test mode, only the error information processing circuit between the error information processing circuit and the data correction circuit is configured to be activated.

3. The error correction code circuit according to claim 1, wherein the data correction circuit is configured to be activated during a read operation in a normal mode.

4. The error correction code circuit according to claim 3, wherein the data correction circuit is configured to be deactivated during a write operation, and to be deactivated during a read operation in the test mode.

5. The error correction code circuit according to claim 1, wherein the data correction circuit comprises:
a correction flag generation circuit configured to generate a correction flag signal in response to the syndrome information; and
a correction circuit configured to generate error-corrected data by correcting an error in the data according to the correction flag signal.

6. The error correction code circuit according to claim 1, further comprising:
an error correction code engine configured to generate the syndrome information by performing an operation on the data.

* * * * *